(12) United States Patent
Van Der Post et al.

(10) Patent No.: US 10,712,673 B2
(45) Date of Patent: Jul. 14, 2020

(54) METHOD OF DETERMINING A PROPERTY OF A STRUCTURE, INSPECTION APPARATUS AND DEVICE MANUFACTURING METHOD

(71) Applicant: ASML NETHERLANDS B.V., Veldhoven (NL)

(72) Inventors: Sietse Thijmen Van Der Post, Utrecht (NL); Koos Van Berkel, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/331,601

(22) PCT Filed: Aug. 17, 2017

(86) PCT No.: PCT/EP2017/070845
§ 371 (c)(1),
(2) Date: Mar. 8, 2019

(87) PCT Pub. No.: WO2018/046272
PCT Pub. Date: Mar. 15, 2018

(65) Prior Publication Data
US 2019/0361360 A1     Nov. 28, 2019

Related U.S. Application Data

(60) Provisional application No. 62/393,521, filed on Sep. 12, 2016.

(51) Int. Cl.
*G03F 7/20* (2006.01)
*G01N 21/956* (2006.01)

(52) U.S. Cl.
CPC ....... *G03F 7/70625* (2013.01); *G01N 21/956* (2013.01); *G03F 7/70641* (2013.01)

(58) Field of Classification Search
CPC ............ G03F 7/70616; G03F 7/70625; G03F 7/70641; G01N 21/956
See application file for complete search history.

(56) References Cited

U.S. PATENT DOCUMENTS

| 5,978,081 A | 11/1999 | Michael et al. |
| 2002/0171815 A1 | 11/2002 | Matsuyama et al. |

(Continued)

FOREIGN PATENT DOCUMENTS

| EP | 2188673 | 2/2009 |
| JP | 2005057205 | 3/2005 |

(Continued)

OTHER PUBLICATIONS

International Search Report and Written Opinion issued in corresponding PCT Patent Application No. PCT/EP2017/070845, dated Nov. 24, 2017.

(Continued)

*Primary Examiner* — Steven Whitesell Gordon
(74) *Attorney, Agent, or Firm* — Pillsbury Winthrop Shaw Pittman LLP

(57) ABSTRACT

An optical system and detector capture a distribution of radiation modified by interaction with a target structure. The observed distribution is used to calculate a property of the structure (e.g. CD or overlay). A condition error (e.g. focus error) associated with the optical system is variable between observations. The actual condition error specific to each capture is recorded and used to apply a correction for a deviation of the observed distribution due to the condition error specific to the observation. The correction in one practical example is based on a unit correction previously defined with respect to a unit focus error. This unit correction can be scaled linearly, in accordance with a focus error specific to the observation.

20 Claims, 6 Drawing Sheets

(56) References Cited

U.S. PATENT DOCUMENTS

| | | |
|---|---|---|
| 2003/0117599 A1 | 6/2003 | Takakuwa et al. |
| 2005/0030537 A1* | 2/2005 | Hayashi .............. G03F 7/70841 356/401 |
| 2006/0033921 A1 | 2/2006 | Den Boef et al. |
| 2006/0066855 A1 | 3/2006 | Boef et al. |
| 2009/0316979 A1 | 12/2009 | Gidon |
| 2010/0201963 A1 | 8/2010 | Cramer et al. |
| 2011/0027704 A1 | 2/2011 | Cramer et al. |
| 2013/0342831 A1 | 12/2013 | Levinski et al. |
| 2016/0061590 A1 | 3/2016 | Pandey |
| 2016/0258810 A1* | 9/2016 | Van Der Post ........... G01J 1/44 |
| 2018/0129140 A1* | 5/2018 | Cramer ............... G03F 7/70625 |

FOREIGN PATENT DOCUMENTS

| | | |
|---|---|---|
| JP | 2010230356 | 10/2010 |
| WO | 2009018911 | 2/2009 |
| WO | 2016030227 | 3/2016 |
| WO | 2016177568 | 11/2016 |

OTHER PUBLICATIONS

Chiozzi, Gianluca, et al: "Field Stabilization on the ESO VLT telescopes", Proc. of SPIE. 4009, Jun. 16, 2000.

Disclosed anonymously: "Image based fast tip/tilt estimation of a substrate with respect to an optical element", Research Disclosure, No. 627064, Jun. 23, 2016.

Japanese Office Action issued in corresponding Japanese Patent Application No. 2019-513765, dated Apr. 7, 2020.

* cited by examiner

METHOD OF DETERMINING A PROPERTY OF A STRUCTURE, INSPECTION APPARATUS AND DEVICE MANUFACTURING METHOD

CROSS-REFERENCE TO RELATED APPLICATIONS

This application is the U.S. national phase entry of PCT patent application no. PCT/EP2017/070845, which was filed on Aug. 17, 2017, which claims the benefit of priority of U.S. provisional application No. 62/393,521, which was filed on Sep. 12, 2016 and which is incorporated herein in its entirety by reference.

FIELD

The present description relates to optical methods and apparatuses for use in determining the properties of structures, particularly microscopic structures. Embodiments may be applied, for example, in an inspection apparatus and/or, for example, in a lithographic apparatus usable, for example, in the manufacture of devices by a lithographic technique. Embodiments may be applied for example in an inspection apparatus employing a solid immersion lens (SIL) or micro-SIL.

BACKGROUND

A lithographic process is one that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. Stepping and/or scanning movements can be involved, to repeat the pattern at successive target portions across the substrate. It is also possible to transfer the pattern from the patterning device to the substrate by imprinting the pattern onto the substrate.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay (the accuracy of alignment between patterns formed in different patterning steps, for example between two layers in a device) and defocus of the lithographic apparatus. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" or "pupil image" from which a property of interest of the target can be determined. Determination of the property of interest may be performed by various techniques: e.g. reconstruction of the target structure by iterative approaches such as rigorous coupled wave analysis or finite element methods; library searches; and principal component analysis.

Examples of scatterometers include angle-resolved scatterometers of the type described in United States patent application publication nos. US 2006-033921 and US 2010-201963. The targets used by such scatterometers are relatively large, e.g. 40 µm by 40 µm, gratings, and the measurement beam generates a spot that is smaller than the grating (i.e., the grating is underfilled). In addition to measurement of feature shapes by reconstruction, diffraction based overlay can be measured using such apparatus, as described in United States patent application publication no. US 2006-066855. Methods and scatterometers are also disclosed in United States patent application publication nos. US 2011-0027704, US 2006-033921 and US 2010-201963. With reduction of the physical dimensions in lithographic processing, there is demand to inspect smaller and smaller features, and also demand to reduce the space occupied by targets dedicated to metrology. The contents of all these applications are incorporated herein by reference.

In order to, e.g., increase the range of scattering angles that can be captured, a solid immersion lens (SIL) or miniature SIL (micro-SIL) can be provided between an objective lens and the target structure. An example of an angularly resolved scatterometer comprising a solid immersion lens (SIL) is disclosed in United States patent application publication no. US 2009-316979. The extreme proximity of the SIL with the target results in a very high effective NA larger than 1, meaning that a greater range of scattering angles can be captured in the pupil image. The application of such a SIL in an inspection apparatus for semiconductor metrology is disclosed in United States patent application publication no. US 2016-061590.

To take advantage of the increasing numerical aperture, the gap between the SIL and the target needs to be set and maintained to an optimal value. For example, the gap may be a few tens of nanometers, for example within the range 10-100 nm to maintain the SIL in the near field of optical interaction with the substrate. Arrangements for controlling the height of the SIL element are described in the United States patent application publication no. US 2016-061590 and in PCT patent application no. PCT/EP2016/058640, filed Apr. 19, 2016. The contents of all the mentioned applications and patent application publications are incorporated herein in their entirety by reference. The use of a SIL can allow formation of a smaller illumination spot, and consequently may also allow the use of smaller targets.

SUMMARY

An issue in an optical system generally is that of controlling accurately the conditions in the optical system so that it performs as desired. In the event of a positioning error, for example, or differential heating effects, for example, within an optical element, aberrations, e.g., can arise that distort the captured image. In the case of scatterometry, for example, distortion in the measured pupil image can result in inaccuracy or uncertainty in the measurements obtained, for example by reconstruction. Examples of positioning error include focus error, and/or tilt error of one or more components. In the case of an optical system including a SIL or micro-SIL, an aberration can be the result of an error in positioning the SIL precisely where the objective lens is focused, with the right height, position and tilt. As such positioning can be controlled dynamically with a servo system throughout a measurement. But, there is generally some imperfection in positioning, and distortions are inevitable. Because the position error changes dynamically between measurements and even during measurements, they cannot be corrected by a conventional calibration technique.

The principles of the present disclosure are not limited either to optical systems including a SIL or micro-SIL element. Nevertheless, embodiments find particular application in an optical system for an inspection apparatus, and in an optical system including a SIL or micro-SIL element.

Embodiments described herein aim to enable, e.g., the measurement of one or more properties of a target structure with greater accuracy, in the presence of a condition error that changes over time. Embodiments described herein aim to enable, e.g., more accurate measurement, without a high computational burden of recalculating diffraction-based models of the optical system.

According to an aspect, there is provided a method of determining a property of a structure, the method comprising:

(a) using an optical system to collect radiation modified by interaction with the structure;

(b) observing a distribution of the collected radiation in a capture plane of the optical system; and (c) calculating the property of the structure based on at least one observation of the distribution of radiation observed in step (b), wherein a condition error associated with the optical system is variable between observations, and wherein the calculation in step (c) includes a correction for a deviation of the distribution due to the condition error specific to the observation.

The condition error can be, e.g., a positioning error (including but not limited to focus error), or a thermal condition error, a gas condition error or a mechanical condition error. Combinations of these errors may be present in a real system, and may be corrected in parallel or in combination.

Some types of error scale in a predictable manner with the magnitude of a condition error. In such cases, an embodiment may involve defining a unit correction corresponding to a unit condition error, and scaling the unit correction in accordance with the actual condition error associated with an observation.

According to an aspect, there is provided an apparatus configured to determine a property of a structure, the apparatus comprising a processor arranged to calculate the property of the structure based on at least one observation of a distribution of radiation in a capture plane of an optical system, the optical system having collected radiation that has been modified by interaction with the structure, wherein a condition error associated with the optical system is variable between observations, and wherein the processor is arranged to apply a correction for a deviation of the distribution due to the condition error specific to the observation.

According to an aspect, there is provided an inspection apparatus for use in determining a property of a structure, the apparatus comprising:

an optical system for collecting radiation modified by interaction with the structure; and an image sensor for observing a distribution of the collected radiation in a capture plane of the optical system, the observed distribution being output for use in calculating the property of the structure, wherein a condition error associated with the optical system is variable between observations, and wherein the inspection apparatus is arranged to output information of the condition error specific to the observation for use in calculating a correction for a deviation of the observed distribution due to the condition error.

According to an aspect, there is provided a computer program product containing one or more sequences of machine-readable instructions for causing a processing system to perform the calculating step of a method as set forth above. The computer program product may comprise a non-transient storage medium.

According to an aspect, there is provided a method of manufacturing devices including a lithographic process step, wherein, before or after performing the lithographic process step, measurements of structures on a substrate are obtained by a method as set forth herein, and wherein the obtained measurements are used to adjust one or more parameters of the lithographic process step for the processing of the substrate and/or further substrates.

These and other aspects will be made apparent to the skilled reader from a consideration of the examples described below.

BRIEF DESCRIPTION OF THE DRAWINGS

Embodiments will now be described, by way of example only, with reference to the accompanying drawings in which.

DETAILED DESCRIPTION OF EXEMPLARY EMBODIMENTS

Before describing embodiments in detail, it is instructive to present an example environment in which embodiments may be implemented.

Figure 1:
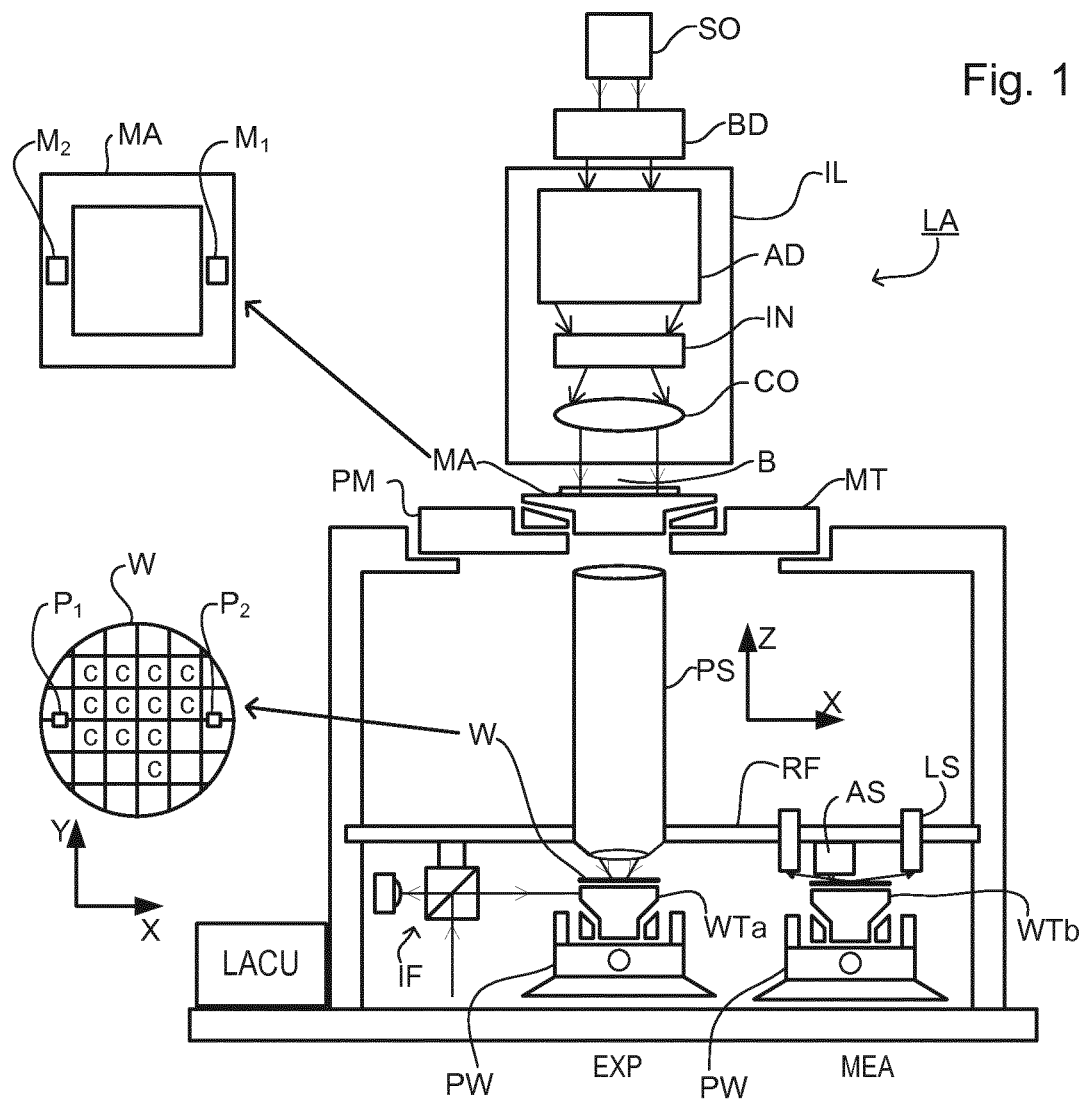
FIG. 1 depicts a lithographic apparatus.

FIG. 1 schematically depicts a lithographic apparatus LA. The apparatus includes an illumination system (illuminator) IL configured to condition a radiation beam B (e.g. UV radiation or DUV radiation), a patterning device support or support structure (e.g. a mask table) MT constructed to support a patterning device (e.g. a mask) MA and connected to a first positioner PM configured to accurately position the patterning device in accordance with certain parameters; two substrate tables (e.g. a wafer table) WTa and WTb each constructed to hold a substrate (e.g. a resist coated wafer) W and each connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so-called assist features. Generally, the pattern imparted to the radiation beam will correspond to a particular functional layer in a device being created in the target portion, such as an integrated circuit.

As here depicted, the apparatus is of a transmissive type (e.g. employing a transmissive patterning device). Alternatively, the apparatus may be of a reflective type (e.g. employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to give it a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g., after mechanical retrieval from a mask library, or during a scan.

Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies. Small alignment marks may also be included within dies, in amongst the device features, in which case it is desirable that the marks be as small as possible and not require any different imaging or process conditions than adjacent features. The alignment system, which detects the alignment marks is described further below.

The depicted apparatus could be used in a variety of modes. In a scan mode, the patterning device support (e.g. mask table) MT and the substrate table WT are scanned synchronously while a pattern imparted to the radiation beam is projected onto a target portion C (i.e. a single dynamic exposure). The speed and direction of the substrate table WT relative to the patterning device support (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment marks on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo-control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems.

Figure 2:
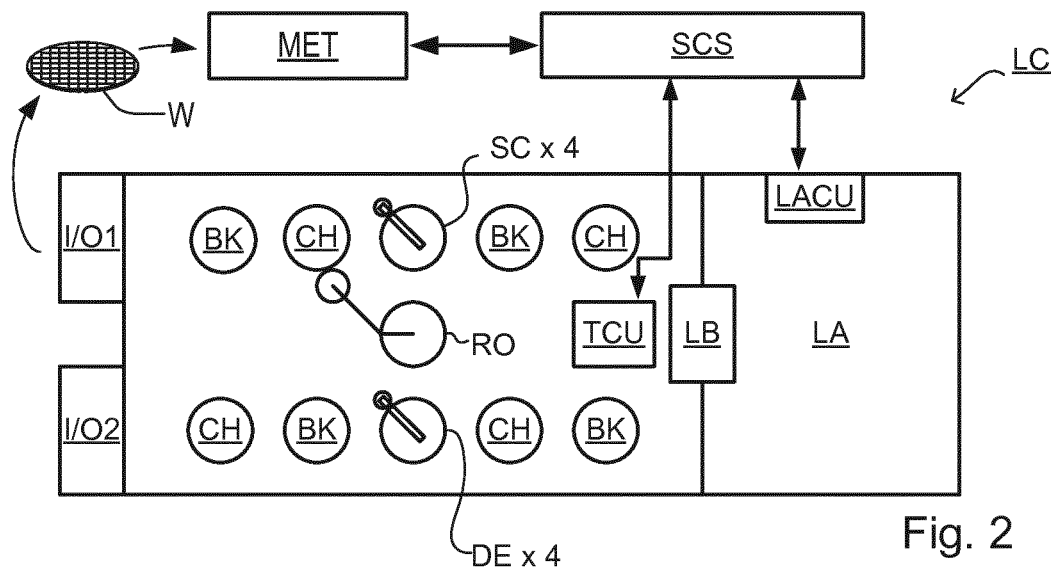
FIG. 2 depicts a lithographic cell or cluster in which an inspection apparatus may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO, picks up substrates from input/output ports I/O1, I/O2, moves them between the different process apparatus and delivers then to the loading bay LB of the lithographic apparatus. These devices, which are often collectively referred to as the "track", are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Inspection Apparatus Example

Figure 3:
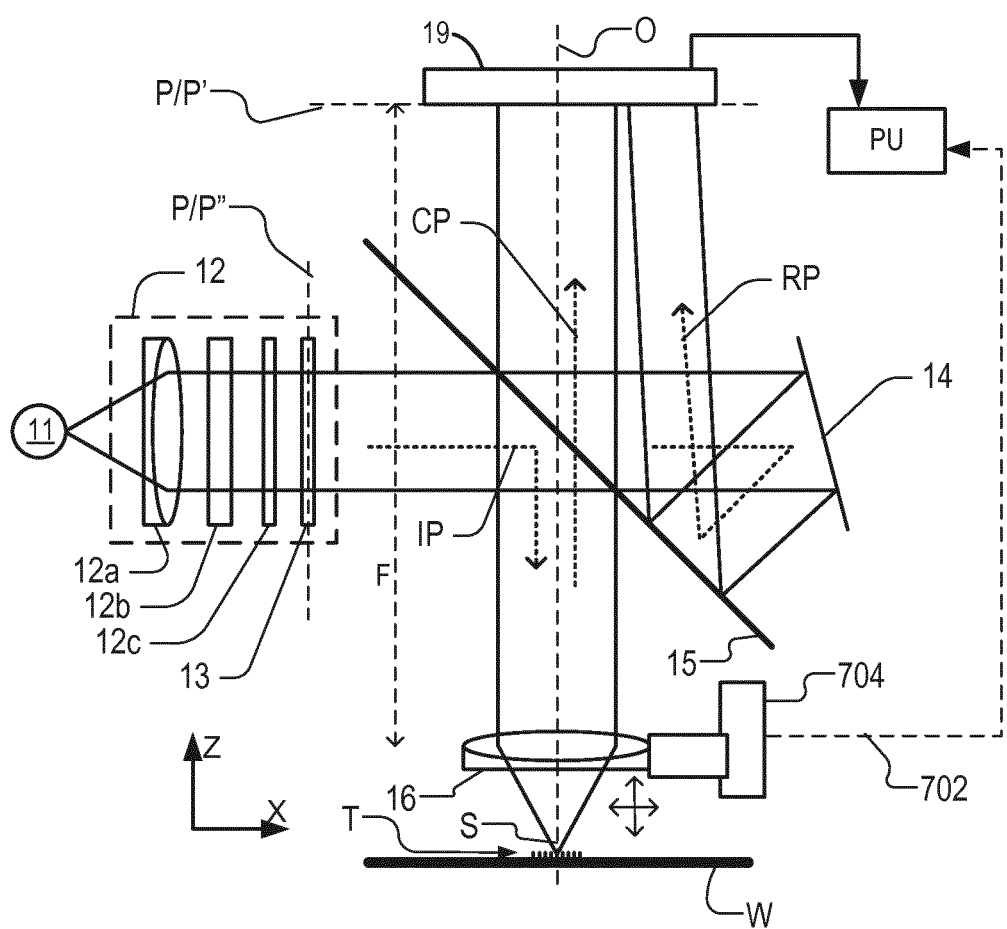
FIG. 3 depicts an example of an inspection apparatus arranged to perform angle-resolved scatterometry, as an example of an optical system in which embodiments may be applied.

FIG. 3 shows the basic elements of an angle-resolved scatterometer that may be used instead of, or in addition to a spectroscopic scatterometer. In this type of inspection apparatus, radiation emitted by a radiation source 11 is conditioned by an illumination system 12. For example, illumination system 12 may include a collimating lens system 12a, a color filter 12b, a polarizer 12c and an aperture device 13. The conditioned radiation follows an illumination path IP, in which it is reflected by partially reflecting surface 15 and focused into a spot S on substrate W via a microscope objective lens 16. A metrology target T may be formed on substrate W. Lens 16 has a high numerical aperture (NA), desirably at least 0.9 and more desirably at least 0.95. Immersion fluid can be used to obtain numerical apertures over 1 if desired. Further increases in NA can be obtained by use of solid immersion lens (SIL) techniques, including a micro-SIL or equivalent.

As in the lithographic apparatus LA, one or more substrate tables may be provided to hold the substrate W during measurement operations. The substrate tables may be similar or identical in form to the substrate tables WTa, WTb of FIG. 1. (In an example where the inspection apparatus is integrated with the lithographic apparatus, they may even be the same substrate tables.) Coarse and fine positioners may be configured to accurately position the substrate in relation to a measurement optical system. Various sensors and actuators are provided, for example, to acquire the position of a target of interest, and to bring it into position under the objective lens 16. Typically many measurements will be made on targets at different locations across substrate W. The substrate support can be moved in X and Y directions to acquire different targets, and in the Z direction to obtain a desired focusing of the optical system on the target. It is convenient to think and describe operations as if the objective lens and optical system are being brought to different locations on the substrate, when in practice the optical system remains substantially stationary and only the substrate moves. Provided the relative position of the substrate and the optical system is correct, it does not matter in principle whether one or both of those is moving in the real world.

Part of the radiation beam is transmitted through the partially reflecting surface 15 and follows a reference path RP towards a reference mirror 14.

Radiation reflected by the substrate, including radiation diffracted by any metrology target T, is collected by lens 16 and follows a collection path CP in which it passes through partially reflecting surface 15 into a detector 19. The detector may be located in the pupil plane P of lens 16, which is notionally located at the back-focal length F of the lens 16. In practice, the back-focal length may be only a few millimeters, and pupil plane itself may be at an inaccessible location within the lens assembly, and may instead be re-imaged with auxiliary optics (not shown) onto the detector located in a so-called conjugate pupil plane P'. The illustration is purely to illustrate the principle, and does not depict the complete optical system. The pupil plane P may also be referred to as the back focal plane. The detector may be a two-dimensional detector so that a two-dimensional angular scatter spectrum or diffraction spectrum of a substrate target T can be measured. In the pupil plane or conjugate pupil plane, the radial position of radiation defines the angle of incidence/departure of the radiation in the plane of focused spot S, and the angular position around an optical axis O defines azimuth angle of the radiation. The detector 19 may be, for example, an array of CCD or CMOS sensors, and may use an integration time of, for example, 40 milliseconds per frame.

The plane of the image sensor forming detector 19 may be regarded as a capture plane of the optical system. While the present example places this capture plane in a back-focal plane of the optical system, the capture plane could be any plane in principle.

Radiation in reference path RP is projected onto a different part of the same detector 19 or alternatively on to a different detector (not shown). A reference beam is often used for example to measure the intensity of the incident radiation, to allow normalization of the intensity values measured in the scatter spectrum.

Returning to the apparatus, the various components of illumination system 12 can be adjustable to implement different metrology 'recipes' within the same apparatus. Color filter 12b may be implemented for example by a set of interference filters to select different wavelengths of interest in the range of, say, 405-790 nm or even lower, such as 200-300 nm. An interference filter may be tunable rather than comprising a set of different filters. A grating could be used instead of interference filters. Polarizer 12c may be rotatable or swappable so as to implement different polarization states in the radiation spot S. Aperture device 13 can be adjusted to implement different illumination profiles. Aperture device 13 is located in a plane P''' conjugate with pupil plane P of objective lens 16 and the plane of the detector 19. In this way, an illumination profile defined by the aperture device defines the angular distribution of radiation incident on the substrate radiation passing through different locations on aperture device 13.

The detector 19 may measure the intensity of scattered radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic-polarized radiation and transverse electric-polarized radiation.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. This pattern is sensitive to optical effects in the lithographic projection apparatus, particularly the projection system PS. For example, illumination symmetry and the presence of aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes. The techniques disclosed herein are not limited to inspection of grating structures, and any target structure, including a blank substrate or a substrate having only flat layers on it, is included within the term "target structure".

In addition to measurement of one or more parameters by reconstruction, angle resolved scatterometry is useful in the measurement of asymmetry of features in product and/or resist patterns. A particular application of asymmetry measurement is for the measurement of overlay, where the target comprises one set of periodic features superimposed on another. The concepts of asymmetry measurement using the instrument of FIG. 3 are described for example in U.S. patent application publication no. US 2006-066855 cited above. Simply stated, while the positions of the diffraction orders in the diffraction spectrum of the target are determined only by the periodicity of the target, asymmetry of intensity levels in the diffraction spectrum is indicative of asymmetry in the individual features which make up the target. In the instrument of FIG. 3, where detector 19 may be an image sensor, such asymmetry in the diffraction orders appears directly as asymmetry in the pupil image recorded by detector 19. This asymmetry can be measured by digital image processing in unit PU, and calibrated against known values of overlay.

Inspection Apparatus with Solid Immersion Lens (SIL)

Figure 4:
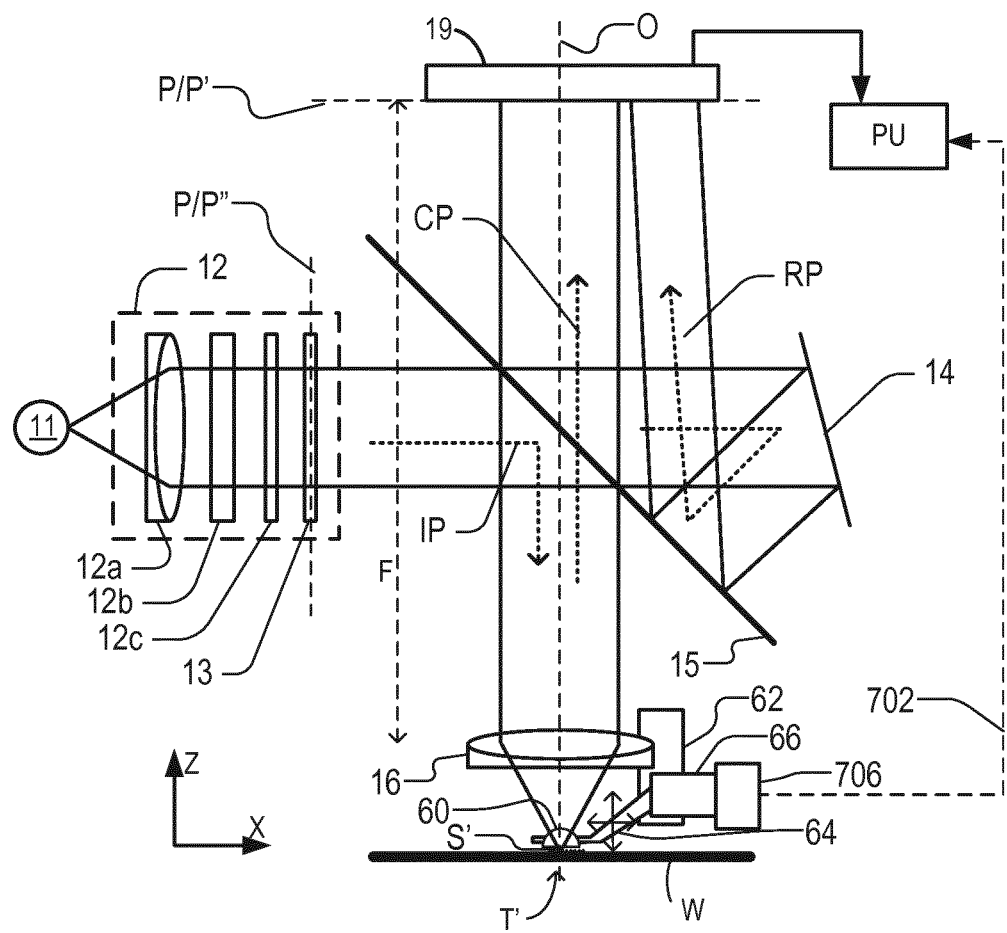
FIG. 4 depicts an example of an inspection apparatus arranged to perform angle-resolved scatterometry, in which an optical system includes a solid immersion lens (SIL), as another example of an optical system in which embodiments may be applied.

FIG. 4 shows a modified version of the scatterometer of FIG. 3, in which a greater angular range of radiation can be collected. Components are labeled the same as in the scatterometer of FIG. 3. Benefits of inspection using an apparatus comprising an SIL and coherent radiation are described for example in United States patent application publication nos. US 2009-316979, and US 2016-061590, cited above. In some embodiments, the use of a SIL also allows a smaller spot S' of illumination to be applied to a smaller grating target T'.

Comparing the apparatus of FIG. 4 with that of FIG. 3, a first difference is the provision of an additional optical element 60 close to the target T'. This additional optical element in the present example is a miniature solid immersion lens (SIL), with a cross-sectional width (e.g., diameter) only on the order of millimeters, for example in the range 1 mm to 5 mm, for example about 2 mm. This comprises in one example a hemisphere of material such as glass of refractive index n that receives rays of radiation at normal incidence to its surface. Immersion of lenses in liquid has been used to increase resolution in microscopy and photolithography. The solid immersion lens has been proposed in microscopy and in lithography as a way of achieving similar gains without the inconvenience of liquid immersion. The range of scatter angles that can be collected by the optical system is increased by the factor n, using a hemispherical SIL. Using a "superhemispherical" SIL, the increase in angular range can be as high as $n^2$. This increased NA can be exploited by reducing the pitch of grating structures used as metrology targets (including using real device structures as metrology targets). The increased NA can be used to increase the portion of the diffraction spectrum captured, for a given pitch and wavelength. However, to ensure that the SIL does indeed increase the performance of the system in this way, the bottom of the hemisphere should either be in contact with the target 'T' or positioned extremely closely to it, within half a wavelength or less. This restricts its practical applications.

So-called micro-SIL lenses may also be used, of which the cross-sectional width (e.g., diameter) is many times smaller, for example about 2 microns in diameter instead of about 2 millimeters. In an example where SIL 60 in the FIG. 5 apparatus is a micro-SIL lens, it may have a cross-sectional width (e.g., diameter) less than 10 μm, potentially less than 5 μm.

Figure 5:
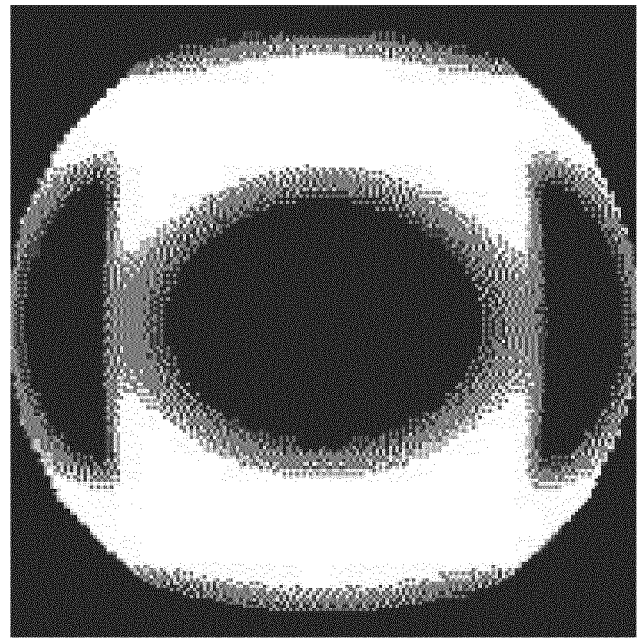
FIG. 5 shows in black and white an example of a pupil image captured by an image sensor in the inspection apparatus of FIG. 5.

Whether a miniature SIL 60 or a micro-SIL lens is used, it can be attached to a movable support so that control of the alignment and proximity to the sample is much simpler than in the case of a lens with a bigger cross-sectional width (e.g., diameter). SIL 60 in FIG. 5 is mounted to a frame 62 supporting objective 16, via an arm 64 and actuator 66. Actuator 66 may be piezoelectric in operation, for example, or voice coil actuated. It may operate in combination with other actuators positioning the objective as a whole in relation to the target. In relation to the coarse and fine positioners mentioned above, for example, the actuator 66 and arm 64 may be regarded as an ultra-fine positioner. The skilled person will appreciate that servo-control loops of these different positioners can be integrated with one another in a manner that need not be described here. The components 62, 64 and 66, together with the substrate table and positioners (mentioned above but not shown), form a support apparatus for positioning the SIL and the target 'T' in close proximity to one another.

In principle, SIL 60 could be mounted rigidly to the frame 62, and/or may be of bigger cross-sectional width (e.g., diameter). The separate mounting and actuator allow easier control of the SIL position. Such an arrangement allows a smaller mass that is required to move, and allows separate control of the objective lens-to-SIL distance and of the SIL-target distance. It also permits control of tip/tilt angles between the SIL and the target structure, which may not be provided in the objective lens stage.

The form of the mounting arm 64 and actuator 66 illustrated here are purely schematic. A practical implementation of a mounting and actuator 66 is described in PCT patent application no. PCT/EP2016/058640 mentioned above.

Inclusion of the SIL 60 opens the possibility of focusing to a much smaller spot S'. As mentioned, the SIL works by capturing the near-field radiation from the target, and to this end it is positioned substantially closer than one wavelength ($\lambda$) of radiation from the target structure, generally closer than a half wavelength, for example around $\lambda/20$. The closer the distance, the stronger will be the coupling of near-field signals into the instrument. The gas gap between SIL 60 and target 'T' may therefore be less than 100 nm, for example between 10 nm and 50 nm. Because the NA of the scatterometer is effectively increased, the pitch of the target grating can also be reduced closer to product dimensions, while still capturing a desired portion of the scattered radiation. Alternatively, the pitch can be maintained while capturing a larger portion of the scatter spectrum. In the case of diffraction-based metrology, the captured portion may include higher order diffraction signals, in addition to zero order scatter spectrum.

In examples where a micro-SIL would be used, incoherent radiation of the type conventionally used in the scatterometers cannot be focused to a micron-sized spot as small as the micro-SIL. Accordingly, in such an embodiment the radiation source 11 may be a coherent source such as a laser. A laser source may be coupled to illumination system 12 via an optical fiber. The limit on the spot size is set by the numerical aperture of the focusing lens system and the laser wavelength. As mentioned in United States patent application publication no. US 2016-061590, the instrument with laser radiation source can be used to perform different types of scatterometry, for example, coherent Fourier scatterometry (CFS).

Condition Errors and Distortion

As already described, in scatterometry, by means of an objective lens 16, a grating or other target structure is illuminated with a large angle distribution (NA) and the radiation scattered back from the grating is recollected by the same objective lens. This scattered radiation forms an angular resolved radiation distribution in the back-focal plane of the objective lens, which is imaged on the detector 19. When using a solid immersion lens (SIL) 60, an additional (hemispherical) lens element is placed under the objective 16 as in FIG. 4. The bottom surface of this lens (SIL tip) is kept at a very small distance (gas gap of, e.g., around 20 nanometers) from the target. As before, the radiation reflected from the target and SIL tip forms a pupil image in the back-focal plane of the objective lens, which is captured digitally by detector 19. An advantage of this method is that due to the high refractive index of the SIL the angular space that can be detected increases. The back-focal plane forms the capture plane of the optical system in this example, as mentioned above.

FIG. 5 presents roughly an example of this radiation distribution, captured digitally as a "pupil image". The critical dimensions of the target (height, width, layer thickness etc.) are obtained by calculation from this image and from certain known parameters of the structure and the optical system. For example in a CD reconstruction method, the difference between the detected radiation distribution (pupil) and a computed radiation distribution for a parameterized model of the target grating is minimized (CD reconstruction), the floating parameters of the model being the critical dimensions. Pixel positions in the X-Y plane of the pupil image correspond to different angles of rays scattered by the target structure. The shape and intensity of the bands of radiation and shade in the pupil image corresponds to the angular distribution of the scattered radiation, and so contains information about the structure.

As already mentioned, the present disclosure is not limited in application to optical systems having SIL or micro-SIL elements in front of an objective lens, but the present disclosure does aim to address certain issues that arise particularly in the use of optical systems with SIL elements. In particular, the disclosure is concerned with issues that can arise from errors in the condition of the optical system, during measurements of target structures. No optical system is capable of perfect imaging, and the deviations from perfect imaging are called aberrations. Condition errors from a variety of sources can cause additional aberrations. If these aberrations are constant, they can be modeled and/or measured. They can potentially be corrected by calibration to remove their effect from the measurements. A variety of different condition errors can arise, however, which vary dynamically, both between measurements and even within measurements. Some examples of these variable condition errors are distortion of a lens due to heating, and/or servo errors in positioning of the objective lens and/or SIL in the Z (focus) direction, or the X-Y direction, or in tilt angle. Focus errors will be discussed as a particular example, without limiting the disclosure to that particular error.

A microscope objective lens is typically corrected for imaging aberration but not necessarily for pupil aberration. Pupil aberration leads to a distorted scatterometry pupil when the target structure is out of focus. The larger the defocus and/or pupil aberration, the stronger the distortion. For this reason, an objective custom-made for angular resolved scatterometry is specified to have as low as possible pupil aberration and a metrology tool is specified to have very tight control of focus. Custom-made optics are expensive. Tight focus control is a particular requirement when a SIL is involved, which is hovering dynamically, nanometers over a target structure. If the effect of aberration could be reduced when processing the captured pupil image, the measurement accuracy would increase. Conversely, for a specified measurement accuracy, the quality and cost of the optical system components could be reduced, if the effect of aberrations could be corrected by processing. Custom optics could be avoided.

One contributor to defocus is relative mechanical vibrations between the objective lens 16 and SIL 60 due to resonances excited by fast motion of the various supports ("stages") and positioning sub-systems (objective lens stage, SIL stage, sensor stage, substrate stage) and external disturbance sources such as ground vibrations and cooling fan vibrations/acoustics. Another contributor is that an optical focus sensor signal is imperfect due to a limited calibration accuracy and a sensitivity to the gas gap (between the SIL and wafer), among others.

As a result, the defocus changes from measurement to measurement and even during one measurement. CD variations due to distortion thus end up in the measurement reproducibility of the metrology tool. The mechanical vibrations could be reduced in principle with high-bandwidth feedback control of the objective stage and with low-transmissible system dynamics. However, this can involve a major design effort and would likely result in a larger volume and higher manufacturing costs.

As an additional issue, for decreasing feature sizes (grating pitches), the sensitivity to distortion due to pupil aberrations was found to increase. Therefore, the distortion effects will become more and more important for further device size nodes.

Introducing a SIL under the objective leads to a significant amount of additional pupil aberrations that are in principle not corrected for in an off-the-shelf objective lens or other optics. These additional aberrations lead to a stronger distortion of the pupil, which in turn leads to a lower precision of the one or more parameters that are determined from it by means of the CD reconstruction or other computational method. Although a custom-made objective lens can be designed to (partly) compensate for the pupil aberrations introduced by the SIL, this again adds to the design challenges and cost. Also such a customized objective-SIL combination may well be even more sensitive to one or more condition errors such as lens-SIL defocus.

Correction of Pupil Distortion Under Condition Errors—Introduction

According to the present disclosure, it is possible to construct a method to correct for the distortion of a scatterometry pupil. It has been discovered that:

1. The amount of defocus can be measured during the pupil image acquisition using a focus error signal existing in the focus control system. Similarly for other positioning error or condition error, servo error signals may be available, or a condition error may be measured directly.

2. For an optical system without one or more condition errors, the pupil aberrations can be determined for a certain defocus using an optical design program. This can be a time-consuming calculation. The pupil distortion can be calculated from these pupil aberrations when the defocus (condition error) is known.

3. The amount of distortion is linearly proportional to the amount of defocus within a reasonable range of variation. Well-defined relationships are expected to exist for other condition errors, even if it is found that they are not linearly proportional to sufficient accuracy.

Figure 6:
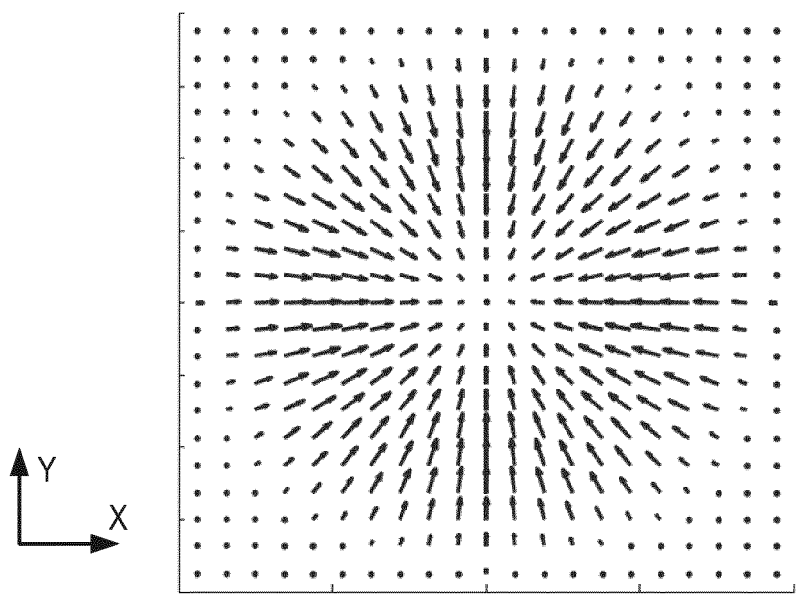
FIG. 6 is a map of distortions introduced in the pupil image of FIG. 5, as a result of focus error between the objective lens and SIL, as an example of a positioning error and a condition error more generally.

4. The distorted pupil at the pupil image sensor 19 is an ideal (undistorted) pupil multiplied by a vector field that represents the distortion. FIG. 6 represents an example of this vector field, as described below.

5. The pupil that is measured is the integration of the radiation on the CCD during the acquisition time. Since the defocus changes during this acquisition time, this pupil is therefore an average of pupils that are distorted in different amounts.

From these observations, a scheme for correcting the defocus or other distortion can be devised. The principles of this will now be described, followed by an implementation example.

Suppose the data acquisition (pupil image capture) takes (for example) 2 or 10 or 50 ms. The defocus $\Delta Z_i = \Delta Z(t_i)$ is measured using the appropriate servo error signal at time instants $t_i$, with a time interval $t_{i+1} - = 10$ μs. Since the servo error signal contains noise, there is allowance for an error $e_i = e(t_i)$ equal to the difference between the measured defocus $\Delta Z_i$ and the real defocus $d_i = d(t_i)$. Hence $\Delta Z_i = d_i + e_i$.

The pupil aberrations for a small amount of defocus, for example 1 nm, can be calculated once in an optical design program. These may be regarded as unit distortions caused by a unit focus error. This can be expressed in a unit distortion vector field as depicted in FIG. 6. This vector plot shows arrows between the points where radiation should have ended without aberrations and where it did end on the pupil image sensor 19, due to the aberrations caused by the unit condition error. The lengths of the arrows are of course exaggerated in this plot, and not real-size. However, where large gradients exist in the distribution of radiation, even a small distortion of the field can lead to a significant effect on the calculated property. From those pupil aberrations of the unit distortion vector field, it can be calculated how much the actual pupil gets distorted for an arbitrary value of focus error.

Since the real optical system is likely slightly different from the nominal system constructed in the optical design program, this vector field $V_0$ is different from the actual distortion vector field $D_0$ by a field $E_0$, such that $V_0=D_0+E_0$. $E_0$ is referred to in the current context as the model errors.

The distortion $V(\Delta Z_i)$ can be calculated for any given measured defocus 44, because it is linearly proportional to the distortion $D_0$ at unit (e.g., 1 nm) defocus, and thus $V(\Delta Z_i)=\Delta z_i*V0$ ($\Delta Z_i$ in nm). With the definitions introduced above, this yields: $V(\Delta Z_i)=(d_i+e_i)*(D_0+E_0)$ or $V(\Delta Z_i) = d_i D_0 + d_i E_0 + e_i D_0 + e_i E_0$. Of these contributions, the actual distortion is $d_i D_0$, the other terms are errors as a result of measurement and simulation imperfections. The upper case symbols in these equations being vector fields and the lower case symbols being scalars, the multiplication * is defined as an element-wise scalar product such that every vector in the vector field is changing its length by the scalar factor.

If P represents the radiation distribution of the ideal (undistorted) pupil over the whole acquisition time as calculated by a Maxwell solver, then the distorted radiation distribution $I_i$ at a certain time interval is given by $I_i=V(\Delta Z_i) \times P/N$, where N is the number of time samples. Here the multiplication× should be understood as the action of a vector field on a scalar field (without changing the basis of the scalar field).

If there are N time intervals $t_{i+1}-t_i$ during the total acquisition time, the integrated (distorted) pupil $I_{dist}$ may be expressed as the sum of the $I_i$ of all N intervals, that is:

$$I_{dist} = \frac{1}{N}\sum_i^N (V(\Delta Z_i) \times P)$$

Writing out the definition of $V(\Delta Z_i)$, this can be written as:

$$I_{dist}=(\bar{d}D_0+\bar{d}E_0+\bar{E}D_0+\bar{e}E_0)\times P \quad (1)$$

where the overbar indicates that the time-average is taken.

Therefore, to make a measurement by scatterometry, not the calculated intensity P but the distortion corrected intensity $I_{dist}$ may be compared with the measured intensity $I_{meas}$. By doing so, strictly speaking, an overcorrection is done since the last three terms are added due to measurement and simulation imperfections. However, for a relatively short measurement time of several milliseconds, $\bar{e}$ (e-bar) may be much smaller than $\bar{d}$ (d-bar) in practice. For example, the signal to noise ratio of the servo error may be in the order of several hundreds. Also, e-bar is likely to be dominated by relatively high-frequency electrical and photon noise (for example in the range 1-100 kHz) that averages to zero during the measurement time, whereas d-bar is dominated by relatively low-frequency motion (for example in the range 20-200 Hz) that is too slow to average to zero during the measurement time. The last two terms in Equation (1) can therefore be ignored.

Concerning the second term in Equation (1), simulations have been performed in the context of SIL based scatterometry. With the aid of an optical design program the pupil aberrations were calculated and from those, the CD measurement variation attributable to defocus for a nominal system was determined and compared with the CD variation due to defocus in combination with altered optical parameters (disposition of lenses etc.). It was found that, for displacements within design tolerances, the CD variation due to distortion is dominated by the defocus itself, and not so much by the model error.

Note that in the example above the calculated pupil P is distorted. It may be more convenient (as assumed in the remainder of this document) to correct instead the measured pupil image (intensity distribution $I_{meas}$). To do this, the vector field can be inverted (flip all vectors head to tail). When this inverted vector field is × multiplied with the measured pupil, the distortion of the measured pupil is undone/corrected according to the model.

Implementation Example

Figure 7:
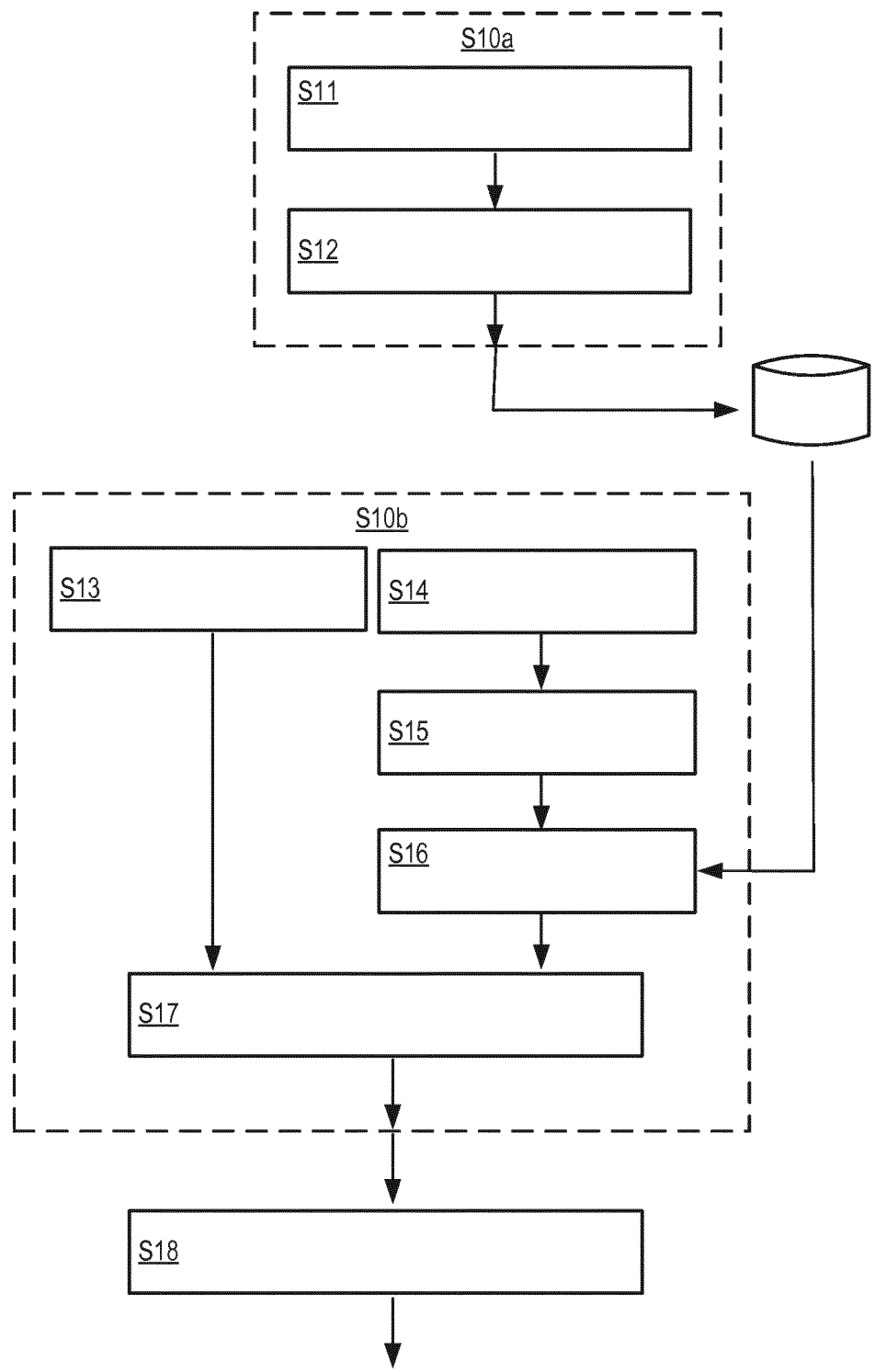
FIG. 7 is a flowchart of a method of measuring a property of a structure while correcting for one or more dynamic condition errors in the capturing of a pupil image, in accordance with an embodiment.

FIG. 7 is a flowchart of a method applying the principles described above to obtain a corrected pupil image. The method comprises steps S10a performed as a pre-process in advance of real-time measurement, and steps S10b performed for each measurement. The method is for example performed by processor PU of the scatterometer of FIG. 3 or FIG. 4, and use a focus error signal 702 obtained from a position controller 704 (FIG. 3) or 706 (FIG. 4). The steps of the method are listed below:

S11. (Pre-process) Pupil aberrations are calculated from the nominal optical design for a fixed defocus (or other unit condition error).

S12. (Pre-process) A unit distortion map (unit distortion vector field) is calculated from the pupil aberrations. This corresponds to a unit correction that may be applied to correct the effects of the aberration attributable to the unit condition error.

S13. (Per measurement) A scatterometry pupil image is acquired.

S14. (Per measurement) Simultaneously with step S13, a time-resolved focus error signal (or other condition error signal) is recorded using a control signal from the appropriate servo controller, or by direct measurement.

S15. (Per measurement) The time-average of the focus error signal is taken.

S16. (Per measurement) A measurement-specific distortion map is constructed by multiplying the average focus error (expressed in units of the defocus used in step S11) with the unit distortion map from step S12.

S17. (Per measurement) The measured scatterometry pupil (S13) is corrected for distortion by the measurement-specific distortion map from step S16.

S18. The corrected pupil is used in the reconstruction, or other calculation, for determining the CD or other property of interest of the target structure.

Note that steps S13 and S14 could be combined in an alternative implementation, where for example the focus error signal may be captured and integrated during the course of the capture.

As discussed above, if the step S18 involves comparison of the captured pupil image with a calculated pupil image, the correction at step S17 could be modified and applied instead to the calculated image, instead of being applied to the captured image. Similarly, the measurement-specific correction could be obtained by scaling of the unit distortion map and then converting to a measurement-specific correction, or by converting to a unit correction, and scaling to a measurement-specific correction. While the simple linear scaling holds in the example described, within a relevant range of focus error, the disclosure encompasses, of course, whatever non-linear scaling behaviors are appropriate in the case of a particular aberration and a particular desired degree of correction performance. These and other alternatives are possible, without departing from the principles of the present disclosure, or the scope of the claims.

The above example is based on a focus error signal. This may be, in a SIL-based system, the focusing (Z-position) of the objective lens relative to the SIL. As already mentioned, other parameters of the condition of the optical system can affect the distortion, and can vary between measurements. For example, X-Y position of the SIL (decenter) and/or tip/tilt (Rx/Ry rotation) of the SIL relative to the optical axis are other types of positioning error that affect the performance of the optical system. Other types of condition error that introduce aberrations include thermal variations in one or more optical components or their mountings (thermal condition error), an error in a gas condition (e.g. pressure, humidity, contamination) in and around the optical system (a gas condition error), and/or a mechanical condition error such as strain (caused by thermal stress or other effects). There may be servo-like controllers for these thermal and/or gas conditions, which also include error signals that can be used to measure the condition error. Alternatively, a temperature sensor, strain gauge or other sensor can be provided with one or more elements of the optical system, to obtain condition error signals specifically for the correction method of the present disclosure.

The depth of reflection of the radiation off the target (phase-depth) is not uniform for all incoming angles of radiation rays. This leads to a pupil-position dependent focus offset that is changing per target-type but is (almost) constant for different targets of the same type. This time-constant angle-dependent offset can be taken into account in the calculation of the distortion map in step S12, rather than requiring a separate step.

The disclosed technique is not limited to SIL-based metrology, or to positioning errors. The disclosed technique is not limited to correcting positional distortions in the pupil image. Where the optical system including pupil image sensor 19 is phase-sensitive, the pupil aberrations calculated in step S16 can be used to correct the phase landscape. Phase information may be captured and used in so-called "lensless imaging" systems, just as one example. The disclosed technique is not limited to correcting pupil images. The capture plane can be any plane of the optical system.

The reconstructed average real distortion $\bar{d}$ (d-bar) can be used for fault detection. For example, a slow drift in the reconstructed parameter d-bar can be treated as an indicator of wear in the mechanics and/or sensor optics. This method can be used in a slightly altered fashion to monitor drift of the focus error signal (and/or any other condition error signal), as explained below.

Any and all of the different corrections described above can be combined in a real implementation. For example, a positioning error in any or all of the dimensions Z, X, Y, Rx, Ry and/or Rz can be measured in step S14, and each can be used to generate a distortion map or other correction map to be applied to the captured pupil image (or calculated pupil image). The correction need not be explicitly formed as a map over the pupil image. For example, where some parameters are derived from the pupil image and compared with calculated parameters, a correction may be defined and performed in the derived parameters, rather than in the original pupil image. The correction need not be defined in the form of a pixel array, but could be parameterized if appropriate.

Application Example

Figure 8:
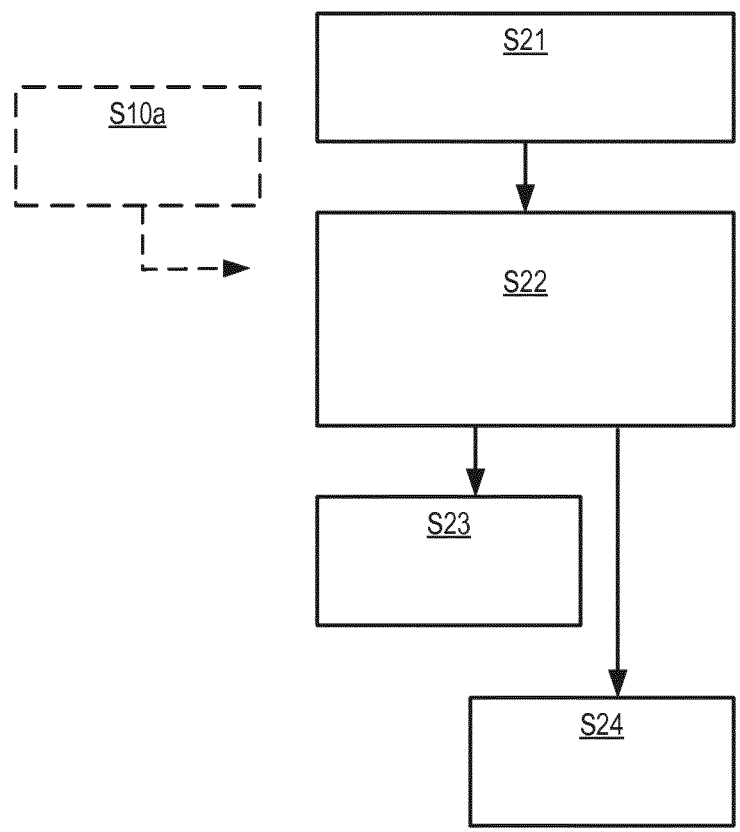
FIG. 8 is a flow chart illustrating a method of controlling performance of a metrology method and/or of a lithographic manufacturing process using measurements made by the method of FIG. 7.

FIG. 8 illustrates the application of a metrology apparatus whose illumination system includes a beam homogenizer of the type disclosed herein, in the control of a lithographic manufacturing system of the type illustrated in FIGS. 1 and 2. The steps will be listed here, and then explained in more detail:

S21: Process substrate to produce structures on the substrate
S22: Measure CD and/or other parameter across the substrate
S23: Update metrology recipe
S24: Update lithography and/or process recipe Previously, step S10a of the correction method of FIG. 7 may be performed, to calculate the unit distortion map or unit correction appropriate to a unit condition error. (Alternatively, the unit distortion map or unit correction can be calculated later, when processing the measurements offline.) Other calibration steps, not described herein, may of course be performed on the optical system.

At step S21, structures are produced across a substrate using the lithographic manufacturing system. At S22, the metrology apparatus 240 and optionally other metrology apparatus and information sources are used to measure a property of the structures across the substrate. These measurements of the property are calculated from pupil images obtained via the scatterometer. A property of interest in may be CD (critical dimension), OVL (overlay) and/or EPE (edge placement error) for example. Corrections obtained by the method of FIG. 7 are used in calculation of measurements at step S22. At step S23, optionally, one or more metrology recipes and/or calibrations of the metrology apparatus are updated in light of the measurement results obtained.

At step S24, measurements of CD or other parameter of interest are compared with desired values, and used to update one or more settings of the lithographic apparatus and/or other apparatus within the lithographic manufacturing system. By providing a metrology apparatus with a correction for a dynamic condition error, more accurate measurements can be obtained. This in turn can lead to better performance when the results of measurements are applied in further measurements and in further control of the lithographic apparatus. Alternatively or in addition, a cheaper optical system can be used to perform measurements with the same accuracy.

Focus Error Signal Monitoring

The above discussion assumes a perfectly calibrated focus error signal such that there is no mismatch between the measured focus error (or other condition error) and the actual defocus. This calibration can be done by using proven techniques, but involves a relatively time-consuming alignment procedure. While operating the metrology tool, drift can cause a non-zero mismatch to occur, which is undesired for the proper functioning of the tool. Such a mismatch would introduce a static contribution in e-bar of the equations above that may never average to zero (even for infinite acquisition time).

For a relatively long measurement time of at least several tenths of a second, d-bar averages to the setpoint value (average control error goes to zero) due to the typical motion frequency of 20-200 Hz and the typically linear dynamics of the mechatronics, whereas e-bar averages to the mismatch between the measured focus error and the actual defocus. In this case, the first two terms of Equation (1) can be ignored. Exploiting this, e-bar can be estimated by measuring on a (known) fiducial target structure. Various fiducial targets can be provided within an inspection apparatus like a scatterometer. These can be measured while substrates are being loaded and unloaded, for example, so that some calibration is possible for every substrate. A grating target can be added to the fiducial set, designed to support the focus calibration and/or other calibration, where one of the existing targets is not suitable.

Suppose a focus error signal (FES) curve defines the focus error signal as a function of defocus. The idea is to measure the actual FES on a well-defined fiducial and compare it with the expected FES (computed/calibrated). By using multiple setpoint values for the defocus, it is possible to identify a mismatch in the curve over a wide range, rather than at one operating point (defocus value). A calibration method can thus be implemented as described in the following steps:

S31. Compute distortion maps based on a set of candidate focus errors and calculate a corrected pupil image for each candidate focus error.

S32. Compare the measured pupils for different focus errors with the calculated pupils for the known optical properties of the fiducial and find the candidate focus error that minimizes the difference.

S33. Where the found focus error signal (that should be zero at zero defocus) exceeds a preset threshold, a signal may be given to realign focus using a time-consuming proven technique. Alternatively, realignment can be deferred until a convenient later time, while the focus error signal is corrected for the measured mismatch, which can be considered as an online calibration. The corrected focus error is then the one used in steps S14-S16 of FIG. 7.

While the principle of monitoring has been described with reference to focus error, it will be understood that any condition error signal can drift from its nominal response curve, and the above technique can be used to monitor the accuracy of that signal and to trigger calibration at an appropriate time.

Conclusion

The correction and calibration methods disclosed herein allow measurements of properties to be made by scatterometry which are less sensitive to dynamically varying condition errors that may introduce aberrations into the optical system of an inspection apparatus such as a scatterometer. As a by-product, diagnostic information about drift of condition settings may be obtained. This may be used to calibrate and correct the condition error signals used in the correction of scatterometry pupil images.

As already described above, many variations and modifications are possible without departing from the principles of the present disclosure. The embodiments described herein are not limited in application to any particular type of inspection apparatus, or even to inspection apparatuses generally.

Further embodiments are disclosed in the list of numbered clauses below:

1. A method of determining a property of a structure, the method comprising:
    causing an optical system to collect radiation modified by interaction with the structure;
    causing an observation of a distribution of the collected radiation in a capture plane of the optical system, wherein a condition error associated with the optical system is variable between observations; and
    calculating the property of the structure based on at least one observed distribution of radiation the calculating including a correction for a deviation of the distribution due to the condition error specific to the observation.

2. The method of clause 1, wherein the correction is based on a unit correction defined with respect to a unit condition error, scaled in accordance with the condition error specific to the observation.

3. The method of clause 2, wherein the unit correction is derived from calculations based on a simulation of the optical system.

4. The method of clause 2 or clause 3, wherein the correction is scaled linearly in proportion to the condition error.

5. The method of any preceding clause, wherein the condition error of the optical system varies within a time period of the observation, and wherein multiple condition error values recorded at multiple sub-periods are used in the calculation.

6. The method of clause 5, wherein the multiple condition error values are combined to form one condition error for defining the correction.

7. The method of any preceding clause, wherein the deviation includes an in-plane distortion of the distribution of the radiation in the capture plane of the optical system, and the correction includes a correction for the in-plane distortion.

8. The method of clause 7, wherein the correction for the in-plane distortion is expressed as a vector field extending over the capture plane of the optical system.

9. The method of any preceding clause, wherein the deviation includes a deviation of phase over the capture plane, and the correction includes a correction of the deviation of phase.

10. The method of any preceding clause, wherein the capture plane is a back focal plane of the optical system, the distribution of radiation comprising a scatter spectrum.

11. The method of any preceding clause, wherein the calculation of the property is based on comparison between the observed distribution and a simulated distribution.

12. The method of clause 11, wherein the correction is applied to the simulated distribution before comparison with the observed distribution.

13. The method of any of clauses 1 to 11, wherein the correction is applied to the observed distribution as a preliminary step in the calculation.

14. The method of any preceding clause, wherein the optical system includes a mounting operable to hold an optical element within a distance from a target structure that is less than a wavelength of the radiation.

15. The method of clause 14, wherein the optical element is a solid immersion lens operable at a focal point of an objective lens, to increase an effective numerical aperture NA of the optical system above 1.

16. The method of clause 15, wherein the condition error relates to an error in positioning the optical element relative to the focal point of the objective lens.

17. The method of any preceding clause, wherein the condition error is a focus error.

18. The method of any preceding clause, wherein the condition error includes an in-plane positioning error.

19. The method of any preceding clause, wherein the condition error includes a tilt error.

20. The method of any preceding clause, wherein the condition error is an error in a thermal condition, or in a gas condition, or in a mechanical condition, of part of the optical system.

21. The method of any preceding clause, wherein a condition of the optical system is controlled by a servo control, the condition error being a by-product of the servo control.

22. The method of any preceding clause, wherein the structure is a microscopic structure formed on a semiconductor substrate.

23. An apparatus configured to determine a property of a structure, the apparatus comprising a processor arranged to calculate the property of the structure based on at least one observation of a distribution of radiation in a capture plane of an optical system, the optical system having collected radiation that has been modified by interaction with the structure, wherein a condition error associated with the optical system is variable between observations, and wherein the processor is configured to apply a correction for a deviation of the distribution due to the condition error specific to the observation.

24. The apparatus of clause 23, wherein the correction is based on a unit correction defined with respect to a unit condition error, scaled in accordance with the condition error specific to the observation.

25. The apparatus of clause 24, wherein the unit correction is derived from calculations based on a simulation of the optical system.

26. The apparatus of clause 24 or clause 25, wherein the correction is scaled linearly in proportion to the condition error.

27. The apparatus of any of clauses 23 to 26, wherein the condition error of the optical system varies within a time period of the observation, and wherein multiple condition error values recorded at multiple sub-periods are used in the calculation.

28. The apparatus of clause 27, wherein the multiple condition error values are combined to form one condition error for defining the correction.

29. The apparatus of any of clauses 23 to 28, wherein the deviation includes an in-plane distortion of the distribution of the radiation in the capture plane of the optical system, and the correction includes a correction for the in-plane distortion.

30. The apparatus of clause 29, wherein the correction for the in-plane distortion is expressed as a vector field extending over the capture plane of the optical system.

31. The apparatus of any of clauses 23 to 30, wherein the deviation includes a deviation of phase over the capture plane, and the correction includes a correction of the deviation of phase.

32. The apparatus of any of clauses 23 to 31, wherein the capture plane is a back focal plane of the optical system, the distribution of radiation comprising a scatter spectrum.

33. The apparatus of any of clauses 23 to 32, wherein the calculation of the property is based on comparison between the observed distribution and a simulated distribution.

34. The apparatus of clause 33, wherein the processor is configured to apply the correction to the simulated distribution before comparison with the observed distribution.

35. The apparatus of any of clauses 23 to 33, wherein the processor is arranged to apply the correction to the observed distribution as a preliminary step in the calculation.

36. The apparatus of any of clauses 23 to 35, wherein the condition error relates to an error in positioning an optical element relative to the focal point of an objective lens in the optical system.

37. The apparatus of any of clauses 23 to 36, wherein the condition error is a focus error.

38. The apparatus of any of clauses 23 to 37, wherein the condition error includes an in-plane positioning error.

39. The apparatus of any of clauses 23 to 38, wherein the condition error includes a tilt error.

40. The apparatus of any of clauses 23 to 39, wherein the condition error is an error in a thermal condition or gas condition or a mechanical condition of part of the optical system.

41. The apparatus of any of clauses 23 to 40, wherein a condition of the optical system is controlled by a servo control, the condition error being a by-product of the servo control.

42. A computer program product comprising machine-readable instructions for causing a programmable processor to implement the processor in the apparatus of any of clauses 23 to 41.

43. A computer program product comprising machine-readable instructions for causing a processing system to perform the method of any of clauses 1 to 22.

44. An inspection apparatus for use in determining a property of a structure, the apparatus comprising:
    an optical system configured to collect radiation modified by interaction with the structure, wherein a condition error associated with the optical system is variable between observations; and
    an image sensor configured to observe a distribution of the collected radiation in a capture plane of the optical system, the observed distribution being output for use in calculating the property of the structure,
    wherein the inspection apparatus is configured to output information of the condition error specific to the observation for use in calculating a correction for a deviation of the observed distribution due to the condition error.

45. The inspection apparatus of clause 44, wherein the condition error of the optical system varies within a time period of the observation, and wherein multiple condition error values recorded at multiple sub-periods are output for use in the calculation.

46. The inspection apparatus of clause 44 or clause 45, wherein the capture plane is a back focal plane of the optical system, the distribution of radiation comprising a scatter spectrum.

47. The inspection apparatus of any of clauses 44 to 46, wherein the optical system includes a mounting operable to hold an optical element within a distance from a target structure that is less than a wavelength of the radiation.

48. The inspection apparatus of clause 47, wherein the optical element is a solid immersion lens operable at a focal point of an objective lens, to increase an effective numerical aperture NA of the optical system above 1.

49. The inspection apparatus of clause 48, wherein the condition error relates to an error in positioning the optical element relative to the focal point of the objective lens.

50. The inspection apparatus of any of clauses 44 to 49, wherein the condition error is a focus error.

51. The inspection apparatus of any of clauses 44 to 50, wherein the condition error includes an in-plane positioning error.

52. The inspection apparatus of any of clauses 44 to 51, wherein the condition error includes a tilt error.

53. The inspection apparatus of any of clauses 44 to 52, wherein the condition error is an error in a thermal condition, or in a gas condition, or in a mechanical condition, of part of the optical system.

54. The inspection apparatus of any of clauses 44 to 53, wherein a condition of the optical system is controlled by a servo control, the condition error being a by-product of the servo control.

55. The inspection apparatus of any of clauses 44 to 54, adapted for inspection of a microscopic structure formed on a semiconductor substrate.

56. A method of manufacturing devices including a lithographic process step, wherein, before or after performing the lithographic process step, measurements of structures on a substrate are obtained by the method of any of claims 1 to 22, and wherein the obtained measurements are used to adjust a parameter of the lithographic process step for the processing of the substrate and/or further substrates.

Although specific reference may be made in this text to the use of inspection apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively.

The terms "light", "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 1-100 nm), as well as particle beams, such as ion beams or electron beams. Such radiations can be used in the applying of patterns to substrate to define the target structures. Such different radiations can also be used as illumination in the scatterometer or other inspection apparatus.

The term "lens", where the context allows, may refer to any one or combination of various types of optical components, including refractive, reflective, magnetic, electromagnetic and electrostatic optical components.

While specific embodiments have been described above, it will be appreciated that the invention may be practiced otherwise than as described. Furthermore, parts of the apparatus may be implemented in the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the spirit and scope of the claims set out below.

The invention claimed is:

1. A method of determining a property of a structure, the method comprising:
   causing an optical system to collect radiation modified by interaction with the structure;
   causing an observation of a distribution of the collected radiation in a capture plane of the optical system, wherein a condition error associated with the optical system and associated with an observation itself is variable between observations; and
   calculating the property of the structure based on at least one observed distribution of radiation, the calculating including a correction for a deviation of the distribution due to the condition error specific to the observation.

2. The method of claim 1, wherein the correction is based on a unit correction defined with respect to a unit condition error, scaled in accordance with the condition error specific to the observation.

3. The method of claim 2, wherein the unit correction is derived from calculations based on a simulation of the optical system.

4. The method of claim 2, wherein the correction is scaled linearly in proportion to the condition error.

5. The method of claim 1, wherein the condition error of the optical system varies within a time period of the observation, and wherein multiple condition error values recorded at multiple sub-periods are used in the calculation.

6. The method of claim 1, wherein the deviation includes an in-plane distortion of the distribution of the radiation in the capture plane of the optical system, and the correction includes a correction for the in-plane distortion.

7. The method of claim 1, wherein the deviation includes a deviation of phase over the capture plane, and the correction includes a correction of the deviation of phase.

8. The method of claim 1, wherein the capture plane is a back focal plane of the optical system, the distribution of radiation comprising a scatter spectrum.

9. The method of claim 1, wherein the calculation of the property is based on comparison between the at least one observed distribution and a simulated distribution.

10. The method of claim 1, wherein the optical system includes a mounting operable to hold an optical element within a distance from a target structure that is less than a wavelength of the radiation.

11. The method of claim 10, wherein the optical element is a solid immersion lens operable at a focal point of an objective, to increase an effective numerical aperture of the optical system above 1.

12. The method of claim 11, wherein the condition error relates to an error in relative positioning between the optical element and the focal point of the objective lens.

13. The method of claim 1, wherein the condition error is a focus error.

14. An apparatus configured to determine a property of a structure, the apparatus comprising a processor system arranged to calculate the property of the structure based on at least one observation of a distribution of radiation in a capture plane of an optical system, the optical system having collected radiation that has been modified by interaction with the structure, wherein a condition error associated with the optical system and associated with an observation itself is variable between observations, and wherein the processor is configured to apply a correction for a deviation of the distribution due to the condition error specific to the observation.

15. A non-transitory computer program product comprising machine-readable instructions that, when executed, are configured to cause a processing system to at least:
   obtain an observation of a distribution of radiation modified by interaction with a structure and collected by an optical system, in a capture plane of the optical system, wherein a condition error associated with the optical system and associated with an observation itself is variable between observations; and
   calculate a property of the structure based on at least one observed distribution of radiation, the calculation including a correction for a deviation of the distribution due to the condition error specific to the observation.

16. The computer program product of claim 15, wherein the correction is based on a unit correction defined with respect to a unit condition error, scaled in accordance with the condition error specific to the observation.

17. The computer program product of claim 16, wherein the unit correction is derived from calculations based on a simulation of the optical system.

18. The computer program product of claim 15, wherein the condition error of the optical system varies within a time period of the observation, and wherein multiple condition error values recorded at multiple sub-periods are used in the calculation.

19. The computer program product of claim 15, wherein the deviation includes an in-plane distortion of the distribution of the radiation in the capture plane of the optical system and the correction includes a correction for the in-plane distortion or wherein the deviation includes a deviation of phase over the capture plane and the correction includes a correction of the deviation of phase.

20. The computer program product of claim 15, wherein the calculation of the property is based on comparison between the at least one observed distribution and a simulated distribution.

* * * * *